US012575273B2

(12) United States Patent
Park et al.

(10) Patent No.: US 12,575,273 B2
(45) Date of Patent: Mar. 10, 2026

(54) DISPLAY DEVICE

(71) Applicant: LG Display Co., Ltd., Seoul (KR)

(72) Inventors: Woosung Park, Paju-si (KR); Kiyoung Sung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/973,484

(22) Filed: Oct. 25, 2022

(65) Prior Publication Data

US 2023/0209929 A1 Jun. 29, 2023

(30) Foreign Application Priority Data

Dec. 27, 2021 (KR) ........................ 10-2021-0188800

(51) Int. Cl.
H10K 59/131 (2023.01)
G09G 3/3258 (2016.01)

(52) U.S. Cl.
CPC ......... H10K 59/131 (2023.02); G09G 3/3258 (2013.01); G09G 2300/0842 (2013.01); G09G 2310/08 (2013.01); G09G 2320/0233 (2013.01); G09G 2320/0686 (2013.01); G09G 2330/028 (2013.01); G09G 2360/16 (2013.01)

(58) Field of Classification Search
CPC ........................... H10K 59/131; G09G 3/3258
See application file for complete search history.

(56) References Cited

U.S. PATENT DOCUMENTS

| | | | | |
|---|---|---|---|---|
| 11,626,467 B2* | 4/2023 | Lee | | H10K 59/131 |
| | | | | 257/72 |
| 11,688,338 B2* | 6/2023 | Feng | | G09G 3/3225 |
| | | | | 345/694 |
| 2021/0056906 A1* | 2/2021 | Lee | | H10K 59/60 |
| 2021/0320164 A1 | 10/2021 | Lee et al. | | |
| 2022/0052141 A1* | 2/2022 | Lee | | H10K 59/124 |

FOREIGN PATENT DOCUMENTS

| | | |
|---|---|---|
| KR | 10-2021-0126838 A | 10/2021 |
| WO | WO 2021/147086 A1 | 7/2021 |

OTHER PUBLICATIONS

Korean Intellectual Property Office, Office Action, Korean Patent Application No. 10-2021-0188800, Mar. 28, 2025, 11 pages.

* cited by examiner

*Primary Examiner* — Sardis F Azongha
(74) *Attorney, Agent, or Firm* — Fenwick & West LLP

(57) ABSTRACT

A display device includes a substrate which includes an active area and a non-active area. The active area includes a first active area and a second active area. The display device further includes a first high potential voltage line that supplies a first high potential voltage to a plurality of first pixels in the first active area and a second high potential voltage line that supplies a second high potential voltage to a plurality of second pixels of the second active area. The first high potential voltage line and the second high potential voltage line are electrically isolated from each other. Therefore, sections of the active area are divided to separately dispose a high potential voltage line in a partial active area to uniformize the luminance in the entire panel area.

22 Claims, 7 Drawing Sheets

VDD(VDD1,VDD2)
VDDL(VDDL1,VDDL2)
PL(PL1,PL2)
NA(NA1,NA2,NA3)

DISPLAY DEVICE

CROSS-REFERENCE TO RELATED APPLICATION

This application claims the priority of Republic of Korea Patent Application No. 10-2021-0188800 filed on Dec. 27, 2021, in the Korean Intellectual Property Office, the disclosure of which is hereby incorporated by reference in its entirety.

BACKGROUND

Field

The present disclosure relates to a display device, and more particularly, to a display device which is capable of providing a uniform luminance without performing additional optical correction.

Description of the Related Art

Currently, as it enters a full-scale information era, a field of a display apparatus which visually expresses electrical information signals has been rapidly developed and studies are continued to improve performances of various display apparatuses such as thin-thickness, light weight, and low power consumption.

A representative display device may include a liquid crystal display device (LCD), a field emission display device (FED), an electro-wetting display device (EWD), and an organic light emitting display device (OLED).

Among them, an electroluminescent display device including an organic light emitting display device is a self-emitting display device so that a separate light source is not necessary, which is different from a liquid crystal display device. Therefore, the electroluminescent display device may be manufactured to have a light weight and a small thickness. Further, since the electroluminescent display device is advantageous not only in terms of power consumption due to the low voltage driving, but also in terms of color implementation, a response speed, a viewing angle, a contrast ratio (CR), it is expected to be utilized in various fields.

SUMMARY

An object to be achieved by the present disclosure is to provide a display device with a uniform luminance in an entire panel area including a camera area.

Another object to be achieved by the present disclosure is to provide a display device in which the optical compensation on the camera area is efficiently performed.

Objects of the present disclosure are not limited to the above-mentioned objects, and other objects, which are not mentioned above, can be clearly understood by those skilled in the art from the following descriptions.

In one embodiment, a display device comprises: a substrate including an active area and a non-active area that is at least partially around the active area, the active area including a first active area and a second active area; a first high potential voltage line that supplies a first high potential voltage to a plurality of first pixels in the first active area; and a second high potential voltage line that supplies a second high potential voltage to a plurality of second pixels in the second active area, wherein the first high potential voltage line and the second high potential voltage line are electrically isolated from each other.

In one embodiment, a display device comprises: a substrate including an active area and a non-active area that is at least partially around the active area, the active area including a first active area and a second active area; a plurality of first pixels in the first active area, the plurality of first pixels supplied with a first high potential voltage; and a plurality of second pixels and a camera in the second active area, the plurality of second pixels supplied with a second high potential voltage that is different from the first high potential voltage.

In one embodiment, a display device comprises: a substrate including an active area and a non-active area that is at least partially around the active area, the active area including a first active area and a second active area; a plurality of first pixels in the first active area; and a plurality of second pixels and a camera in the second active area, wherein a first portion in the first active area includes a first number of first pixels from the plurality of first pixels, and a second area in the second active area having a same area as the first area includes a second number of second pixels from the plurality of second pixels that is less than the first number of first pixels, but a maximum luminance of the second area is substantially the same as a maximum luminance of the first area.

Other detailed matters of the exemplary embodiments are included in the detailed description and the drawings.

According to the present disclosure, sections of the active area are divided to separately dispose a high potential voltage line in a partial active area including a camera area to uniformize the luminance in the entire panel area.

According to the present disclosure, the high potential voltage line is separately disposed so that the high potential voltage is compensated only for a specific area, thereby efficiently performing the optical compensation.

The effects according to the present disclosure are not limited to the contents exemplified above, and more various effects are included in the present specification.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The above and other aspects, features and other advantages of the present disclosure will be more clearly understood from the following detailed description taken in conjunction with the accompanying drawings, in which.

Figure 1:
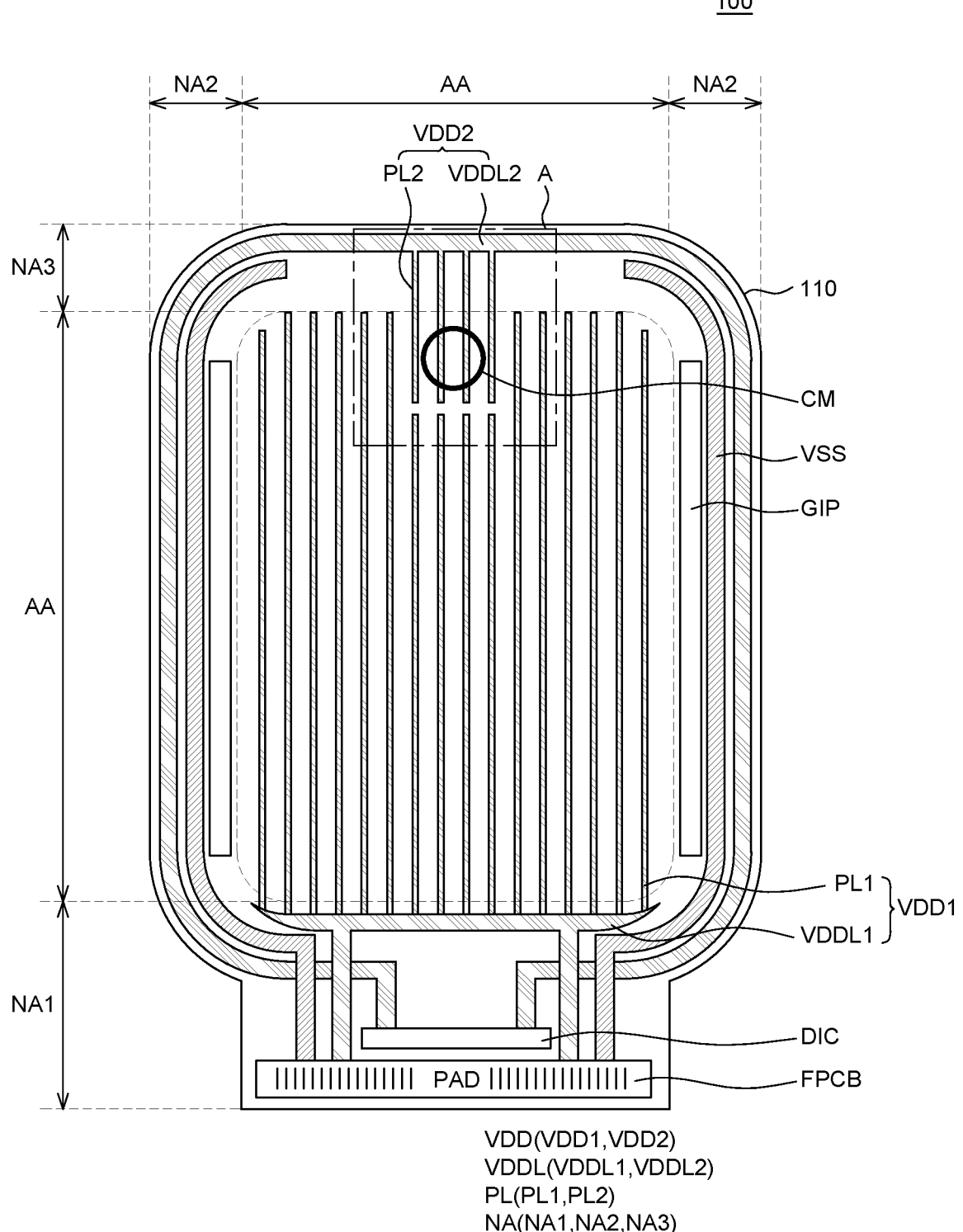
FIG. 1 is a schematic plan view of a display device according to an exemplary embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, a display device according to exemplary embodiments of the present disclosure will be described in detail with reference to accompanying drawings.

FIG. 1 is a schematic plan view of a display device according to an exemplary embodiment of the present disclosure. In FIG. 1, for the convenience of description, among various components of the display device 100, a substrate 110, a flexible printed circuit board FPCB, a data driving circuit DIC, a low potential voltage line VSS, a gate driving circuit GIP, and a high potential voltage line VDD are illustrated. However, the display device 100 may include other components than those shown in FIG. 1.

Referring to FIG. 1, the substrate 110 includes an active area AA and a non-active area NA.

The substrate 110 is a base member for supporting various components of the display device 100 and may be configured by an insulating material. For example, the substrate 110 may be configured by glass or a plastic material such as polyimide.

In the active area AA, images are displayed and a plurality of pixels are disposed. In the active area AA, the display elements for displaying images and driving units for driving the display elements may be disposed. For example, when the display device 100 is an organic light emitting display device, the display element may be an organic light emitting diode which includes an anode, an organic layer, and a cathode. The driving unit may be configured by various components for driving the organic light emitting element, such as a power line PL, a gate line, a data line, a thin film transistor, and a storage capacitor. Hereinafter, for the convenience of description, it is assumed that the display device 100 is an organic light emitting display device, but the display device 100 is not limited to the organic light emitting display device.

Referring to FIG. 1, the substrate 110 has a different shaped corner area and a corner of the active area AA may have a shape corresponding to the different shaped corner area of the substrate 110. The corners of the substrate 110 and the active area AA may have a round shape, for example. However, the present disclosure is not limited thereto and the substrate 110 and the active area AA may have various shapes suitable for a design of an electronic device in which the display device 100 is mounted.

In the non-active area NA, an image is not displayed and various wiring lines and circuits for driving a display element of the active area AA are disposed. For example, in the non-active area NA, a gate driving circuit GIP, a data driving circuit DIC, a high potential voltage line VDD, a low potential voltage line VSS, and a pad unit PAD may be disposed.

The non-active area NA may be an area extending from the active area AA, but is not limited thereto and may be an area enclosing the active area AA.

The non-active area NA includes a first non-active area NA1, a second non-active area NA2, and a third non-active area NA3. The first non-active area NA1 is an area extending from a lower side of the active area AA, the second non-active area NA2 is an area extending from a left side and a right side of the active area AA, and the third non-active area NA3 is an area extending from an upper side of the active area AA.

In the first non-active area NA1, a data driving circuit DIC and a pad unit PAD may be disposed. When the substrate 110 includes a different shaped corner area, the first non-active area NA2 may have a shape corresponding to the shape of the substrate 110 and the active area AA.

In the pad unit PAD, various signal lines or pads connected to a PCB are disposed. In the pad unit PAD, a power supply pad, a data pad, and a gate pad may be disposed. In the pad unit PAD a flexible printed circuit board FPCB may be disposed so that a power management integrated circuit (PMIC) may be included.

The data driving circuit DIC is mounted in or connected to a separate PCB to be connected to the display panel by means of the pad unit PAD or mounted or connected between the pad unit PAD and the active area AA in the form of chip on panel (COP). The data driving circuit DIC includes at least one source drive integrated circuit (IC). The at least one source drive IC is supplied with digital video data and a source timing control signal from a timing controller. At least one source drive IC converts the digital video data into a gamma voltage to generate a data voltage in response to the source timing control signal and supplies the data voltage through the data line of the active area AA.

The second non-active area NA2 is an area extending from the left side and the right side of the active area AA. The gate driving circuit GIP may be disposed in the second non-active area NA2.

The gate driving circuit GIP sequentially supplies the gate voltage to the gate line of the active area AA in response to the control of the timing controller. In accordance with the driving method, the gate driving circuit GIP may be located only in at least one side of the substrate 110, or as illustrated in FIG. 1, may be disposed in both non-active areas NA. The gate driving circuit GIP may be connected to a bonding pad of the substrate 110 by a tape automated bonding (TAB) method or a chip on glass (COG) method or may be implemented to be a gate in panel (GIP) type to be directly disposed in the substrate 110.

In one embodiment, the low potential voltage line VSS and the high potential voltage line VDD may be disposed in the non-active area NA.

The power supply unit of the display device 100 outputs a high potential voltage and a low potential voltage that is less than the high potential voltage. The high potential voltage and the low potential voltage output from the power supply unit are supplied to the active area AA. The high potential voltage is supplied to the active area AA by means of the high potential voltage line VDD and the low potential voltage is supplied to the active area AA by means of the low potential voltage line VSS.

The low potential voltage line VSS is a wiring line which is electrically connected to a second electrode of the light emitting diode of the active area AA and may be disposed so as to enclose the gate driving circuit GIP and the active area AA. Alternatively, as illustrated in FIG. 1, the low potential voltage line VSS is disposed along the second non-active area NA2 adjacent to the active area AA of the substrate 110 with a constant line width and encloses the remaining part other than parts of the first non-active area NA1 and the third non-active area NA3 adjacent to the active area AA of the substrate 110. That is, a first end of the low potential voltage line is disposed on one side of the first non-active area NA1 and a second end of the low potential voltage line is disposed on one side of the third non-active area NA3. An area between the first end and the second end of the low potential voltage line VSS may be disposed to extend along the second non-active area. Accordingly, the low potential voltage line VSS may have a "( )" shape (e.g., a curved shape) in which parts of the first non-active area NA1 and the third non-active area NA3 of the substrate 110 are open in a plan view.

Next, a pixel of the active area AA is supplied with a high potential voltage by means of the high potential voltage line VDD disposed in the non-active area NA. The high potential voltage line VDD may include a high potential voltage link line VDDL and a plurality of power lines PL. That is, the high potential voltage link line VDDL is supplied with a high potential voltage from a power supply pad disposed in the pad unit PAD to transmit the high potential voltage along the plurality of power lines PL disposed in the active area AA.

The high potential voltage line VDD may be disposed in the first to third non-active areas NA1, NA2, and NA3. That is, the high potential voltage line VDD may be disposed so as to enclose the entire active area AA.

However, the high potential voltage line VDD includes a first high potential voltage line VDD1 and a second high potential voltage line VDD2 which are electrically separated from each other. At this time, the first high potential voltage line VDD1 may be disposed in the first non-active area NA1 but not the second non-active area NA2 and the third non-active area NA3. In contrast, the second high potential voltage line VDD2 may be disposed in the first to third non-active areas NA1, NA2, and NA3. Therefore, the first high potential voltage line VDD1 supplies a high potential voltage to a pixel of the active area AA by means of the first power line PL1 and the second high potential voltage line VDD2 supplies a high potential voltage to a pixel of the active area AA by means of the second power line PL2.

A first high potential voltage link line VDDL1 included in the first high potential voltage line VDD1 may be disposed to extend in the same direction as the pad unit PAD and the data driving circuit DIC. That is, the first high potential voltage link line VDDL1 may be disposed to extend in a direction parallel to a lower surface of the active area AA (e.g., a horizontal direction). When the first high potential voltage link line VDDL1 adjacent to the active area AA has a shape corresponding to the different shaped corner area of the substrate 110 and the active area AA, the first high potential voltage link line VDDL1 may have a shape corresponding to the shape of the active area AA and the substrate 110 in a different shaped corner area. That is, as illustrated in FIG. 1, when the corner area of the substrate 110 and the active area AA has a round shape, a width of the first high potential voltage link line VDDL1 in the different shaped corner area may be smaller than a width in a center area of the substrate 110. Further, the first high potential voltage link line VDDL1 may be disposed to be more adjacent to one side of the active area AA (e.g., the lower side) than the low potential voltage line VSS.

A second high potential voltage link line VDDL2 included in the second high potential voltage line VDD2 is disposed along the first to third non-active areas NA1, NA2, and NA3 adjacent to the active area AA of the substrate 110 with a constant line width. The second high potential voltage link line VDDL2 encloses a remaining portion excluding a part of the first non-active area NA1 adjacent to the active area AA of the substrate 110. A first end of the second high potential voltage link line VDDL2 is disposed on one side of the first non-active area NA1 and a second end of the second high potential voltage link line VDDL2 is disposed on the other side of the first non-active area NA1. Specifically, referring to FIG. 1, the first end of the second high potential voltage link line VDDL2 is connected to a first side of the data driving circuit DIC and the second end of the second high potential voltage link line VDDL2 is connected to a second side of the data driving circuit DIC. That is, the second high potential voltage link line VDDL2 receives a second high potential voltage from the data driving circuit DIC. An area between first end and the second end of the second high potential voltage link line VDDL2 may be disposed so as to enclose the second non-active area NA2 and the third non-active area NA3. Accordingly, the second high potential voltage link line VDDL2 may have an inverted "U" shape in which one side corresponding to the first non-active area NA1 of the substrate 110 is open in the plan view. Further, the second high potential voltage link line VDDL2 may be disposed to be closer to an outer periphery of the substrate 110 than the gate driving circuit GIP and the low potential voltage line VSS at a left side and a right side of the active area AA. That is, in the second non-active area NA2, the gate driving circuit GIP and the low potential voltage line VSS may be disposed between the second high potential voltage link line VDDL2 and the active area AA.

Hereinafter, components of the display device 100 according to an exemplary embodiment of the present disclosure will be described in more detail with reference to FIGS. 2 to 5 together.

Figure 2:
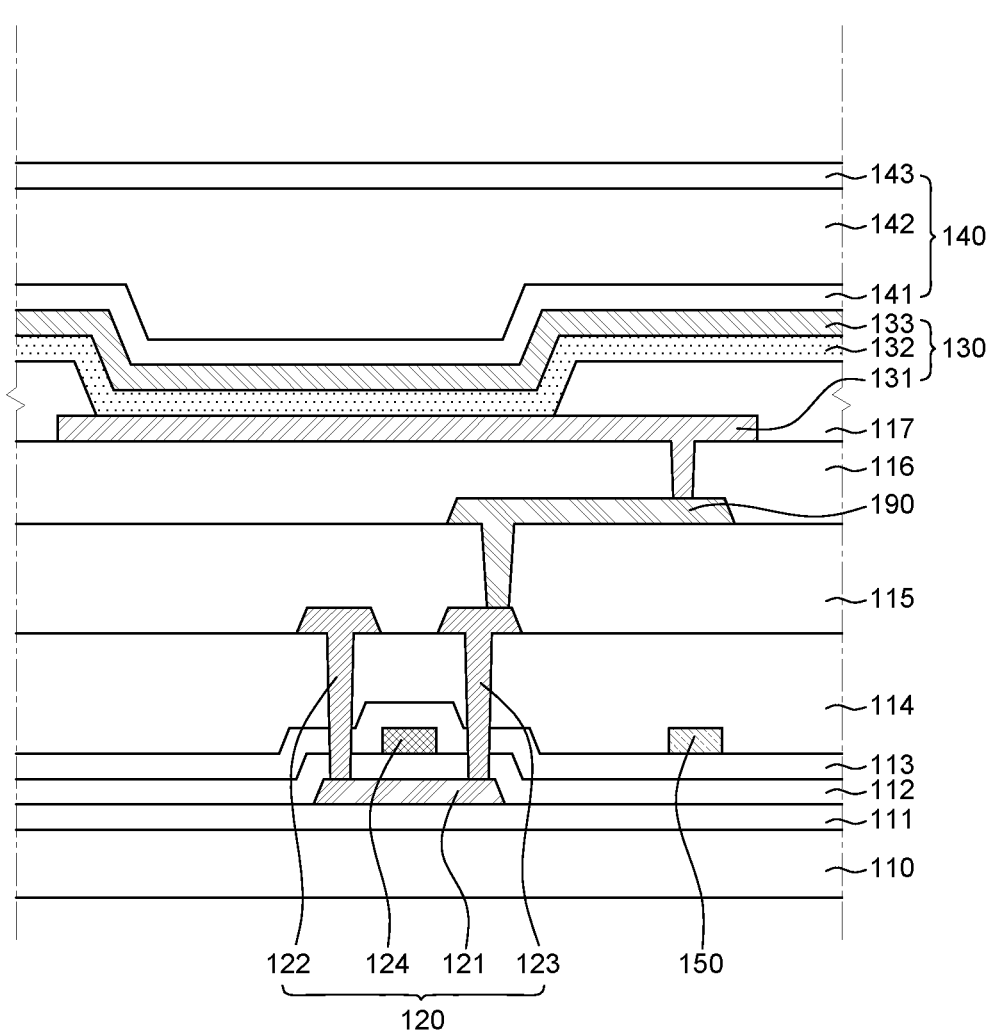
FIG. 2 is a cross-sectional view of a display device according to an exemplary embodiment of the present disclosure.

FIG. 2 is a cross-sectional view of the active area AA of the display device according to an exemplary embodiment of the present disclosure.

Referring to FIG. 2, the display device 100 according to the exemplary embodiment of the present disclosure includes a substrate 110, a buffer layer 111, a thin film transistor 120, a gate insulating layer 112, a first interlayer insulating layer 113, a conductive layer 150, a second interlayer insulating layer 114, a first planarization layer 115, a connection electrode 190, a second planarization layer 116, a bank 117, a light emitting diode 130, and an encapsulation unit 140.

The substrate 110 may support various components of the display device 100. The substrate 110 may be formed of glass or a plastic material having flexibility. When the substrate 110 is formed of a plastic material, for example, the substrate may be formed of polyimide (PI).

The buffer layer 111 is disposed on the substrate 110. The buffer layer 111 may be formed by a single layer of silicon nitride SiNx or silicon oxide SiOx or a multilayer thereof. The buffer layer 111 may serve to improve adhesiveness between layers formed on the buffer layer 111 and the substrate 110 and block alkali components leaked from the substrate 110.

The thin film transistor 120 is disposed on the buffer layer 111. The thin film transistor 120 includes an active layer 121, a gate electrode 124, a source electrode 122, and a drain electrode 123. Here, depending on the design of the pixel circuit, the source electrode 122 may serve as a drain electrode and the drain electrode 123 may serve as a source electrode. The active layer 121 of the thin film transistor 120 may be disposed on the buffer layer 111.

The active layer 121 may be formed of various materials, such as polysilicon, amorphous silicon, or oxide semiconductor. The active layer 121 may include a channel region in which a channel is formed when the thin film transistor 120 is driven and a source region and a drain region on both sides of the channel region. The source region refers to a portion of the active layer 121 which is connected to the source electrode 122 and the drain region refers to a portion of the active layer 121 which is connected to the drain electrode 123.

The gate insulating layer 112 is disposed on the active layer 121 of the thin film transistor 120. The gate insulating layer 112 may be formed as a single layer of silicon nitride SiNx or silicon oxide SiOx or a multilayer thereof. In the gate insulating layer 112, a contact hole through which the source electrode 122 and the drain electrode 123 of the thin film transistor 120 are connected to the source region and the drain region of the active layer 121 of the thin film transistor 120 may be formed.

The gate electrode 124 of the thin film transistor 120 may be disposed on the gate insulating layer 112. The gate electrode 124 may be formed of a single layer or a multilayer formed of any one of molybdenum (Mo), copper (Cu), titanium (Ti), aluminum (Al), chrome (Cr), gold (Au), nickel (Ni), and neodymium (Nd) or an alloy thereof. The gate electrode 124 may be formed on the gate insulating layer 112 so as to overlap the channel region of the active layer 121 of the thin film transistor 120.

The first interlayer insulating layer 113 may be disposed on the gate insulating layer 112 and the gate electrode 124. The first interlayer insulating layer 113 may be configured by a single layer of silicon nitride SiNx or silicon oxide SiOx or a multilayer thereof. A contact hole through which the source region and the drain region of the active layer 121 of the thin film transistor 120 are exposed may be formed in the first interlayer insulating layer 113.

The conductive layer 150 is disposed on the first interlayer insulating layer 113. The conductive layer 150 may be a wiring line or an electrode disposed between the gate electrode 124 and the source electrode 122 and the drain electrode 123.

The second interlayer insulating layer 114 may be disposed on the first interlayer insulating layer 113 and the conductive layer 150. The second interlayer insulating layer 114 may be formed of the same material as the first interlayer insulating layer 113. That is, the second interlayer insulating layer 114 may be configured by a single layer of silicon nitride SiNx or silicon oxide SiOx or a multilayer thereof. A contact hole through which the source region and the drain region of the active layer 121 of the thin film transistor 120 are exposed may be formed in the second interlayer insulating layer 114.

The source electrode 122 and the drain electrode 123 of the thin film transistor 120 may be disposed on the second interlayer insulating layer 114.

The source electrode 122 and the drain electrode 123 of the thin film transistor 120 may be connected to the active layer 121 of the thin film transistor 120 through the contact holes formed in the gate insulating layer 112, the first interlayer insulating layer 113, and the second interlayer insulating layer 114. Therefore, the source electrode 122 of the thin film transistor 120 may be connected to the source region of the active layer 121 through the contact holes formed in the gate insulating layer 112, the first interlayer insulating layer 113, and the second interlayer insulating layer 114. Further, the drain electrode 123 of the thin film transistor 120 may be connected to the drain region of the active layer 121 through the contact holes formed in the gate insulating layer 112, the first interlayer insulating layer 113, and the second interlayer insulating layer 114.

The source electrode 122 and the drain electrode 123 of the thin film transistor 120 may be formed by the same process. Further, the source electrode 122 and the drain electrode 123 of the thin film transistor 120 may be formed of the same material. The source electrode 122 and the drain electrode 123 of the thin film transistor 120 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof.

The first planarization layer 115 may be disposed on the source electrode 122, the drain electrode 123, and the second interlayer insulating layer 114. As illustrated in FIG. 2, a contact hole may be formed in the first planarization layer 115 to expose the drain electrode 123. The first planarization layer 115 may be an organic material layer which planarizes an upper portion of the thin film transistor 120. For example, the first planarization layer 115 may be formed of an organic material, such as acryl resin, epoxy resin, phenolic resin, polyamide resin, or polyimide resin. However, it is not limited thereto and the first planarization layer 115 may be an inorganic material layer for protecting the thin film transistor 120. For example, the first planarization layer 115 may be formed of an inorganic material such as silicon nitride (SiNx) or silicon oxide (SiOx). The first planarization layer 115 may be configured by a single layer of silicon nitride (SiNx) or silicon oxide (SiOx) or a multilayer thereof.

The connection electrode 190 may be disposed on the first planarization layer 115. The connection electrode 160 may be connected to the drain electrode 123 of the thin film transistor 120 through the contact hole of the first planarization layer 115. The connection electrode 190 may serve to electrically connect the thin film transistor 120 and the light emitting diode 130. For example, the connection electrode 190 may serve to electrically connect the drain electrode 123 of the thin film transistor 120 and a first electrode 131 of the light emitting diode 130. The connection electrode 190 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The connection electrode 190 may be formed of the same material as the source electrode 122 and the drain electrode 123 of the thin film transistor 120.

The second planarization layer 116 may be disposed on the connection electrode 190 and the first planarization layer 115. Further, as illustrated in FIG. 2, a contact hole may be formed in the second planarization layer 116 to expose the connection electrode 190. The second planarization layer 116 may be an organic material layer which planarizes an upper portion of the thin film transistor 120. For example, the second planarization layer 116 may be formed of an organic material, such as acryl resin, epoxy resin, phenolic resin, polyamide resin, or polyimide resin.

The light emitting diode 130 may be disposed on the second planarization layer 116. The light emitting diode 130 includes a first electrode 131, an emission structure 132, and a second electrode 133. The first electrode 131 of the light emitting diode 130 may be disposed on the second planarization layer 116. The first electrode 131 may be electrically connected to the connection electrode 190 through the contact hole formed in the second planarization layer 116. Therefore, the first electrode 131 of the light emitting diode 130 is electrically connected to the connection electrode 190 through the contact hole formed in the second planarization layer 116 to be electrically connected to the thin film transistor 120.

The first electrode 131 may be formed to have a multi-layered structure including a transparent conductive layer and an opaque conductive layer having a high reflection efficiency. The transparent conductive layer may be formed of a material having a high work function, such as indium tin oxide (ITO) or indium zinc oxide (IZO). The opaque conductive layer may be formed to have a single layer or a multi-layered structure including Al, Ag, Cu, Pb, Mo, Ti, or an alloy thereof. For example, the first electrode 131 may be formed to have a structure in which a transparent conductive layer, an opaque conductive layer, and a transparent conductive layer are sequentially laminated. However, the first electrode 131 is not limited thereto, but may also be formed to have a structure in which the transparent conductive layer and the opaque conductive layer are sequentially laminated.

Since the display device 100 according to the exemplary embodiment of the present disclosure is a top emission display device, the first electrode 131 may be an anode electrode. When the display device 100 is a bottom emission type, the first electrode 131 disposed on the second planarization layer 116 may be a cathode electrode.

The bank 117 may be disposed on the first electrode 131 and the second planarization layer 116. An opening may be formed in the bank 117 to expose the first electrode 131. Since the bank 117 defines an emission area of the display device 100, the bank 117 may also be referred to as a pixel definition layer.

The emission structure 132 including an emission layer may be disposed on the first electrode 131.

The emission structure 132 of the light emitting diode 130 may be formed by laminating a hole layer, an emission layer, and an electron layer on the first electrode 170 in this order or a reverse order. Further, the emission structure 132 may include first and second emission structures which are opposite to each other with a charge generating layer therebetween. In this case, any one emission layer of the first and second emission structures generates blue light and the other one emission layer of the first and second emission structures generates yellow-green light so that white light may be generated by the first and the second emission structures. The white light generated in the emission structure 132 is incident onto a color filter disposed above the emission structure 132 to implement color images. In addition, individual emission structures 132 generate color light corresponding to individual sub pixels without having separate color filters to implement color images. For example, the emission structure 132 of a red R sub pixel generates red light, the emission structure 132 of a green G sub pixel generates green light, and the emission structure 132 of a blue B sub pixel generates blue light.

The second electrode 133 may be further disposed on the emission structure 132. The second electrode 133 of the light emitting diode 130 may be disposed on the emission structure 132 so as to be opposite to the first electrode 131 with the emission structure 132 therebetween. In the display device 100 according to the exemplary embodiment of the present disclosure, the second electrode 133 may be a cathode electrode. The encapsulation unit 140 may be further disposed on the second electrode 133 to suppress moisture permeation.

The encapsulation unit 140 may include a first inorganic encapsulation layer 141, an organic encapsulation layer 142, and a second inorganic encapsulation layer 143. The first inorganic encapsulation layer 141 of the encapsulation unit 140 may be disposed on the second electrode 133. The organic encapsulation layer 142 may be disposed on the first inorganic encapsulation layer 141. Further, the second inorganic encapsulation layer 143 may be disposed on the organic encapsulation layer 142. The first inorganic encapsulation layer 141 and the second inorganic encapsulation layer 143 of the encapsulation unit 140 may be formed of an inorganic material such as silicon nitride SiNx or silicon oxide SiOx. The organic encapsulation layer 142 of the encapsulation unit 140 may be formed of an organic material, such as acryl resin, epoxy resin, phenolic resin, polyamide resin, or polyimide resin.

The second inorganic encapsulation layer 143 covers upper surfaces and side surfaces of the first inorganic encapsulation layer 141 and the organic encapsulation layer 142. The second inorganic encapsulation layer 143 minimizes or blocks external moisture or oxygen from permeating the first inorganic encapsulation layer 141 and the organic encapsulation layer 142. At this time, the first inorganic encapsulation layer 141 and the second inorganic encapsulation layer 143 serve to block the permeation of moisture or oxygen and the organic encapsulation layer 142 serves to planarize an upper portion of the first inorganic encapsulation layer 141. Therefore, the encapsulation unit 140 may cover the gate driving circuit and the dam of the active area AA and the non-active area NA, but a configuration of the encapsulation unit 140 is not limited thereto.

Figure 3:
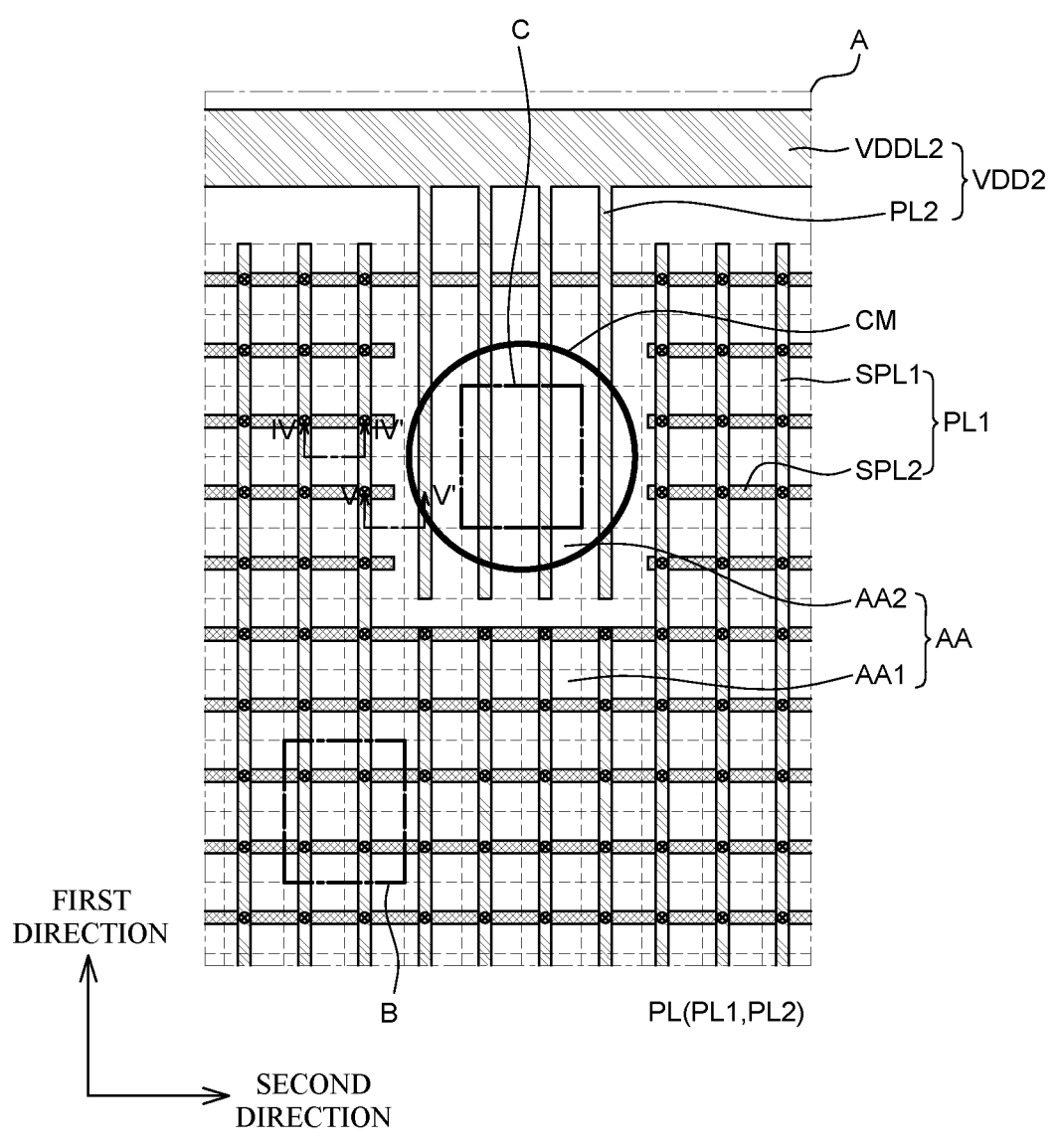
FIG. 3 is an enlarged plan view of an area A of FIG. 1 according to an exemplary embodiment of the present disclosure.

FIG. 3 is an enlarged plan view of an area A of FIG. 1 according to one embodiment. In FIG. 3, the second high potential voltage link line VDDL2 and a plurality of power lines PL, among various components of the display device 100, are illustrated for the convenience of description. A plurality of areas represented with the dotted line in FIG. 3 corresponds to a plurality of pixels.

As described above, the high potential voltage line VDD includes a high potential voltage link line VDDL and a plurality of power lines PL and the high potential voltage link line VDDL is supplied with a high potential voltage from a power supply pad to transmit the high potential voltage along the plurality of power lines PL disposed in the active area AA.

Referring to FIG. 3, the high potential voltage line VDD of the display device 100 according to the exemplary embodiment of the present disclosure includes a first high potential voltage line VDD1 and a second high potential voltage line VDD2 which are electrically separated from each other. As illustrated in FIG. 1, the first high potential voltage line VDD1 may be disposed in the first non-active area NA1 and the second high potential voltage line VDD2 may be disposed in the first to third non-active areas NA1, NA2, and NA3 so as to enclose the active area AA.

The first high potential voltage line VDD1 supplies a high potential voltage to a pixel of the active area AA by means of the first power line PL1 and the second high potential voltage line VDD2 supplies a high potential voltage to a pixel of the active area AA by means of the second power line PL2. However, the active area AA in which the first power line PL1 and the second power line PL2 supply the high potential voltage may be divided to supply different high potential voltages to each active area.

Accordingly, the active area AA may be divided into a first active area AA1 and a second active area AA2 according to one embodiment. In the first active area AA1, a first power line PL1 which is connected to the first high potential voltage link line VDDL1 to supply a first high potential voltage to a plurality of first pixels is disposed. In the second active area AA2, a second power line PL2 which is connected to the second high potential voltage link line VDDL2 to supply a second high potential voltage to a plurality of second pixels is disposed.

First, the second active area AA2 is an area in which the camera CM is disposed so that a camera CM hole to embed the camera CM in the display device 100 and the camera CM is disposed in the camera CM hole. Accordingly, a size and a position of the second active area AA2 may be determined so as to correspond to the camera CM. That is, the second active area AA2 may be provided in a position that includes the camera CM and may have a size that is large enough to include an area in which the camera CM is disposed. Referring to FIG. 3, even though it is illustrated that the camera CM has a circular shape, it is not limited thereto and may be formed to have a polygonal or oval shape. That is, a shape of the camera CM may be determined according to a shape of a corresponding sensor module and the shape of the second active area AA2 is also determined thereby.

Further, the second active area AA2 may further include an auxiliary area as well as the area in which the camera CM is disposed. When the camera CM is disposed in an inner area rather than an end portion of the active area AA, an auxiliary area may be disposed between the area corresponding to the camera CM and the second high potential voltage link line VDDL2. That is, the auxiliary area may refer to an active area AA which is disposed between the first active area AA1 and the second high potential voltage link line VDDL2.

Next, the first active area AA1 may refer to a remaining active area AA excluding the second active area AA2 that includes the area corresponding to the camera CM and the auxiliary area. The remaining active area which encloses the second active area AA2 corresponds to the first active area AA1.

Referring to FIG. 3, in each of the plurality of first pixels disposed in the first active area AA1, even though it is not illustrated in FIG. 3, a plurality of first power lines PL1 connected to the first high potential voltage link line VDDL disposed in the first non-active area NA1 may be disposed. At this time, the plurality of first power lines PL1 may include a first sub power line SPL1 extending in a first direction and a second sub power line SPL2 extending in a second direction perpendicular to the first sub power line SPL1. The first sub power line SPL1 may transmit a high potential voltage to each pixel by means of the second sub power line SPL2 so that the first sub power line SPL1 and the second sub power line SPL2 may be electrically connected. When the first sub power line SPL1 and the second sub power line SPL2 are disposed on different layers, the first sub power line SPL1 and the second sub power line SPL2 may be electrically connected by means of a plurality of contact holes.

In the plurality of second pixels disposed in the second active area AA2, the plurality of second power lines PL2 connected to the second high potential voltage link line VDDL2 may be disposed. At this time, the plurality of second power lines PL2 extends in the first direction to be disposed in a direction parallel to the first sub power line SPL1 of the plurality of first power lines PL1. At this time, the second sub power line SPL2 extending in the second direction, among the plurality of first power lines PL1, may be disposed to cross the second active area AA2. However, the second sub power line SPL2 is not disposed in an area of the second active area AA2 corresponding to the camera CM, but may be disposed to cross only the auxiliary area. That is, the plurality of second power lines PL2 may cross the second sub power line SPL2 in an area between the camera CM and the second high potential voltage link line VDDL2. The second sub power line SPL2 is included in the plurality of first power lines PL1 and is connected to the first high potential voltage link line VDDL1 to transmit a high potential voltage which is different from that of the plurality of second power lines PL2. Therefore, the second sub power line SPL2 and the plurality of second power lines PL2 are not electrically connected even in an intersecting area. That is, the second sub power line SPL2 and the plurality of second power lines PL2 may intersect in the auxiliary area in the plan view, but a contact hole is not formed.

Figure 4:
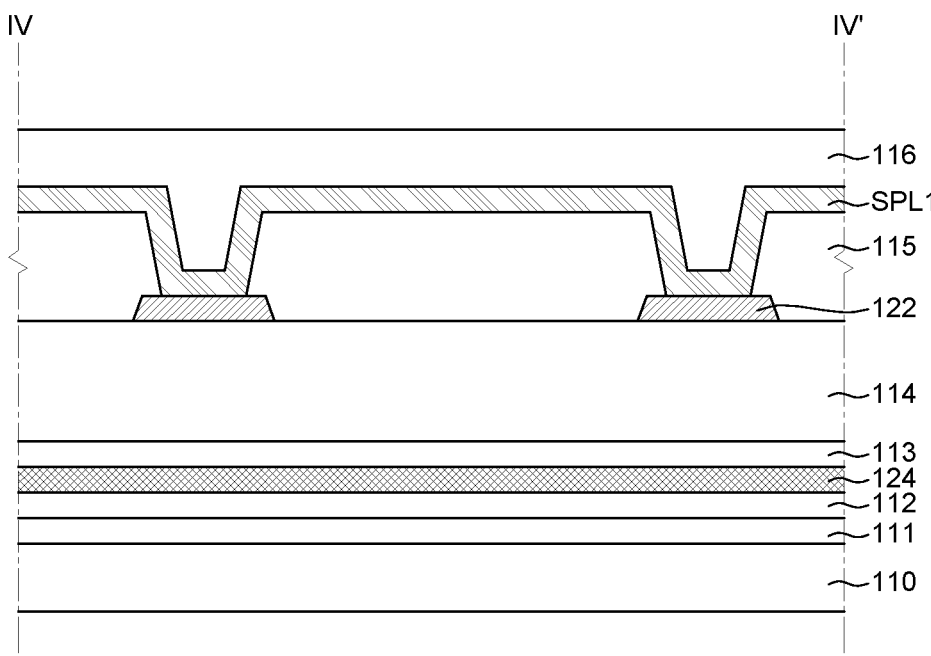
FIG. 4 is a cross-sectional view taken along IV-IV' of FIG. 3 according to an exemplary embodiment of the present disclosure.
Figure 5:
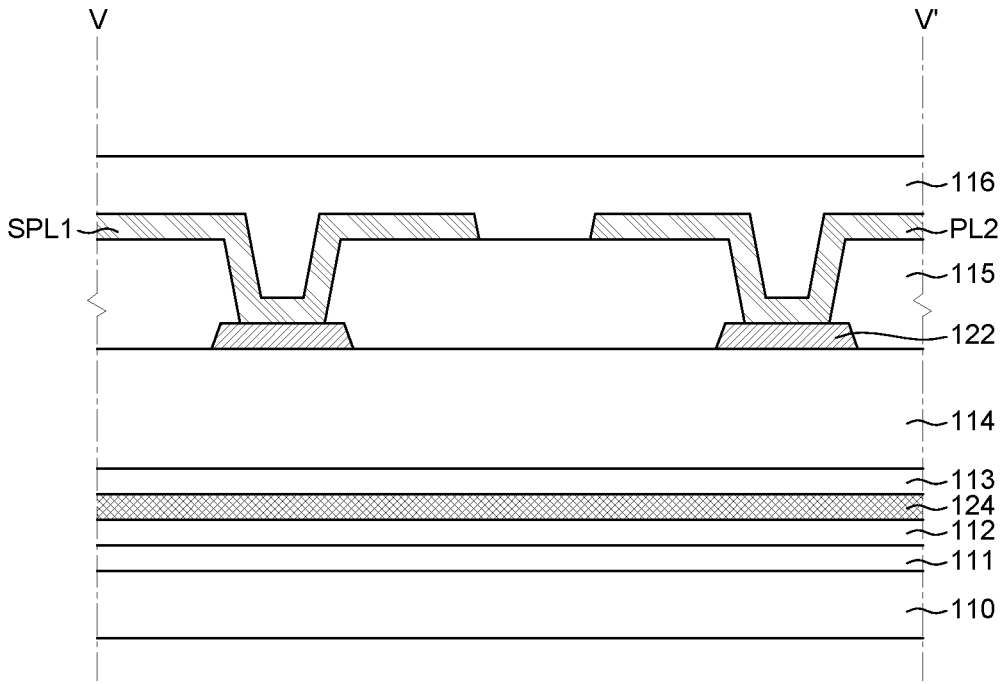
FIG. 5 is a cross-sectional view taken along V-V' of FIG. 3 according to an exemplary embodiment of the present disclosure.

FIG. 4 is a cross-sectional view taken along IV-IV' of FIG. 3 and FIG. 5 is a cross-sectional view taken along V-V' of FIG. 3 according to one embodiment.

FIG. 4 is a cross-sectional view taken along IV-IV' of FIG. 3 so that it is a cross-sectional view in the first active area AA1 and FIG. 5 is a cross-sectional view taken along V-V' of FIG. 3 so that it is a cross-sectional view of an area between the first active area AA1 and the second active area AA2. In FIGS. 4 and 5, for the convenience of description, only the configuration from the substrate 110 to the second planarization layer 116 is illustrated.

Referring to FIGS. 4 and 5, the plurality of first sub power lines SPL1 and the plurality of second power lines PL2 may be disposed between the first planarization layer 115 and the second planarization layer 116. That is, the plurality of first sub power lines SPL1 and the plurality of second power lines PL2 may be formed of the same material on the same layer as the connection electrode 190. However, it is not limited thereto, the plurality of first sub power lines SPL1 and the plurality of second power lines PL2 may be disposed between the second interlayer insulating layer 114 and the first planarization layer 115. That is, the plurality of first sub power lines SPL1 and the plurality of second power lines PL2 may be formed of the same material on the same layer as the source electrode 122 and the drain electrode 123 of the thin film transistor 120. Further, the plurality of first sub power lines SPL1 and the plurality of second power lines PL2 may be disposed on different layers. Specifically, when the plurality of first sub power lines SPL1 is formed of the same material on the same layer as the source electrode 122 and the drain electrode 123, the plurality of second power lines PL2 may be formed of the same material on the same layer as the connection electrode 190.

However, referring to FIG. 5, the plurality of first sub power lines SPL1 which transmits a high potential voltage to a plurality of first pixels of the first active area AA1 and the plurality of second power lines PL2 which transmits a high potential voltage to the plurality of second pixels of the second active area AA2 need to be electrically isolated from each other. Therefore, the plurality of first sub power lines SPL1 and the plurality of second power lines PL2 need to be disconnected between the first active area AA1 and the second active area AA2. That is, when the plurality of first sub power lines SPL1 and the plurality of second power lines PL2 are formed on the same layer as the connection electrode 190, side surfaces of the plurality of first sub power lines SPL1 and the plurality of second power lines PL2 may be in contact with the second planarization layer 116 between the first active area AA1 and the second active area AA2. Alternatively, when the plurality of first sub power lines SPL1 and the plurality of second power lines PL2 are formed on the same layer as the source and drain electrodes, side surfaces of the plurality of first sub power lines SPL1 and the plurality of second power lines PL2 may be in contact with the first planarization layer 115 between the first active area AA1 and the second active area AA2.

Accordingly, the display device 100 according to the exemplary embodiment of the present disclosure may uniformly adjust the luminance with an area which does not overlap the camera CM while displaying an image in an area overlapping the camera CM.

In recent years, in order to seat the camera in the active area, a position where the camera is disposed is changed. This is because when the area where the camera is seated is provided in the non-active area, a size of the non-active area is increased so that a size of the active area is correspondingly reduced. In contrast, when an area where the camera is seated is provided in the active area, the non-active area is correspondingly reduced so that a size of the active area is maximized.

However, in the related art, in order to allow the external light to enter the camera, an active area in a position corresponding to the camera is formed to be transparent without having a pixel. Accordingly, even though the area corresponding to the camera is an inner side of the active area, a pixel is not disposed so that an image of the display panel is not visible in the corresponding area. Therefore, there is a problem in that a part of the screen becomes a dark spot.

Therefore, in recent years, the pixel is disposed also in an area of the active area corresponding to the camera so that the pixel transmitted by means of the display panel is visible in the entire active area without being disconnected. However, in order to perform the function of the camera, external light which is incident from a front surface of the display panel needs to be transmitted to the camera so that a smaller number of pixels is disposed in the area corresponding to the camera to allow the external light to pass through the area in which no pixel is disposed.

Figure 6:
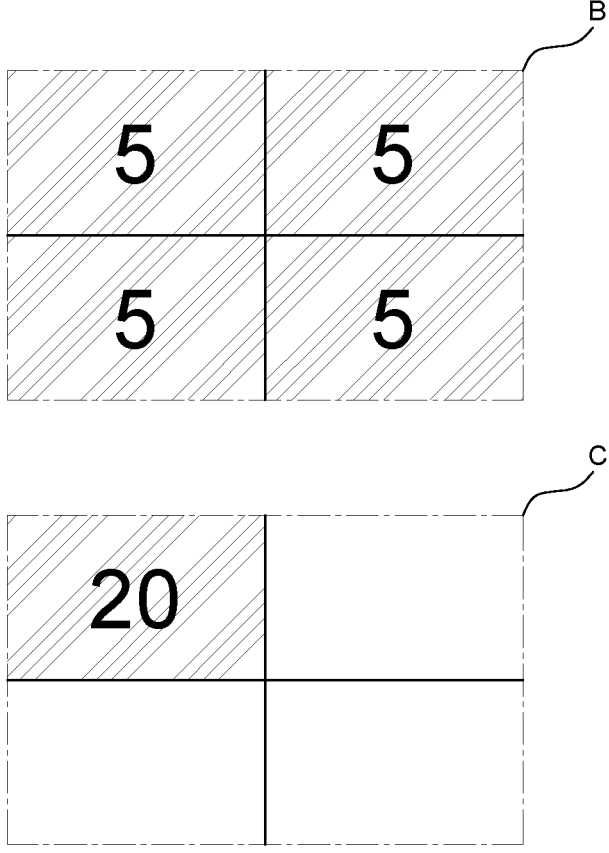
FIG. 6 is a schematic plan view of areas B and C of FIG. 3 according to an exemplary embodiment of the present disclosure.

With regard to this, FIG. 6 is a schematic plan view of an area B of the first active area AA1 and an area C of the second active area AA2 and in FIG. 6, only the positions in the areas B and C where the pixel is disposed are briefly illustrated for the convenience of description. Referring to FIG. 6, in the first active area AA1 which is a normal active area AA, a plurality of first pixels may be disposed in all areas where the pixels are disposed and in the second active area AA2 including the area corresponding to the camera CM, a plurality of second pixels may be disposed in a partial area of the area where the pixels are disposed. That is, the number of the plurality of first pixels per unit area (e.g., a portion of the first active area AA1) disposed in the first active area AA1 may be greater than the number of the plurality of second pixels per unit area (e.g., a portion of the second active area AA12 disposed in the second active area AA2.

When the number of the plurality of second pixels per unit area disposed in the second active area AA2 is less than the number of the plurality of first pixels per unit area disposed in the first active area AA1, the difference in the density of the pixels may be generated in the first active area AA1 and the second active area AA2. In the second active area AA2, there is an area where the pixel is not disposed so that external light may be incident into the camera CM disposed in the second active area AA2. However, the number of pixels disposed per unit area is less than that of the first active area AA1 so that when the same voltage is applied to the plurality of first pixels and the plurality of second pixels, the luminance difference may be caused in the first active area AA1 and the second active area AA2.

Therefore, in the display device 100 according to the exemplary embodiment of the present disclosure, different high potential voltages are set to be transmitted to the first active area AA1 and the second active area AA2 to uniformly adjust the luminance in the entire active area AA. That is, the number of the plurality of second pixels disposed per unit area in the second active area AA2 is less than the number of the plurality of first pixels per unit area in the first active area AA1 so that the second high potential voltage which is transmitted by means of the second high potential voltage line VDD2 may be set to be greater than the first high potential voltage. The luminance is proportional to both the number of pixels disposed per unit area and the high potential voltage applied to each pixel. Therefore, the number of the plurality of first pixels disposed in the first active area AA1 is greater than the number of the plurality of second pixels disposed in the second active area AA2 and the first high potential voltage is less than the second high potential voltage, the luminance of the first active area AA1 and the luminance of the second active area AA2 may be balanced. Specifically, referring to FIG. 6, it is assumed that the area B of the first active area AA1 has the same area as the area C and four first pixels are disposed therein, and each first pixel has a maximum luminance of "5". It is further assumed that the area C of the second active area AA2 has the same area, one second pixel is disposed therein, and the second pixel is applied with a high potential voltage to have a maximum luminance of "20". Under this assumption, in both the area B and the area C, the luminance is 20. As a result, according to the present disclosure, the maximum luminance of the first active area AA1 and the maximum luminance of the second active area AA2 are equal to each other in the same area.

Further, the display device 100 according to the exemplary embodiment of the present disclosure efficiently compensates for the voltage using an existing optical compensation (OC) method. The optical compensation method which uniformly adjusts the luminance of the active area AA includes two types of voltage compensation methods. One is to compensate for the high potential voltage which has been described above and the other one is to compensation for a data voltage. However, when the data voltage is compensated, there is a problem in that the first active area and the second active area need to be separately compensated. That is, according to the optical compensation method which has been performed in recent years, the optical compensation is performed only with respect to a center of the active area, that is, the first active area. However, when the first active area and the second active area are separately compensated like the data voltage compensation method, there may be a problem in that a turn-around time (TAT) is increased. In contrast, when the high potential voltage is compensated, after applying the optical compensation result for the center of the active area AA to the first active area AA1 and the second active area AA2, an offset is applied to the second high potential voltage by an insufficient amount of the luminance of the second active area AA2 to finally correct the luminance That is, when the correction is performed with the high potential voltage as described in the present disclosure, the problem of the delay of the turn-around time (TAT) may be suppressed. As a result, the display device 100 according to the exemplary embodiment of the present disclosure divides the high potential voltage line VDD into the first high potential voltage line VDD1 and the second high potential voltage line VDD2 while using the existing optical compensation method which uses an optical compensation result at the center of the active area AA. Accordingly, the luminances of the first active area AA1 and the second active area AA2 may be efficiently uniformly adjusted.

Figure 7:
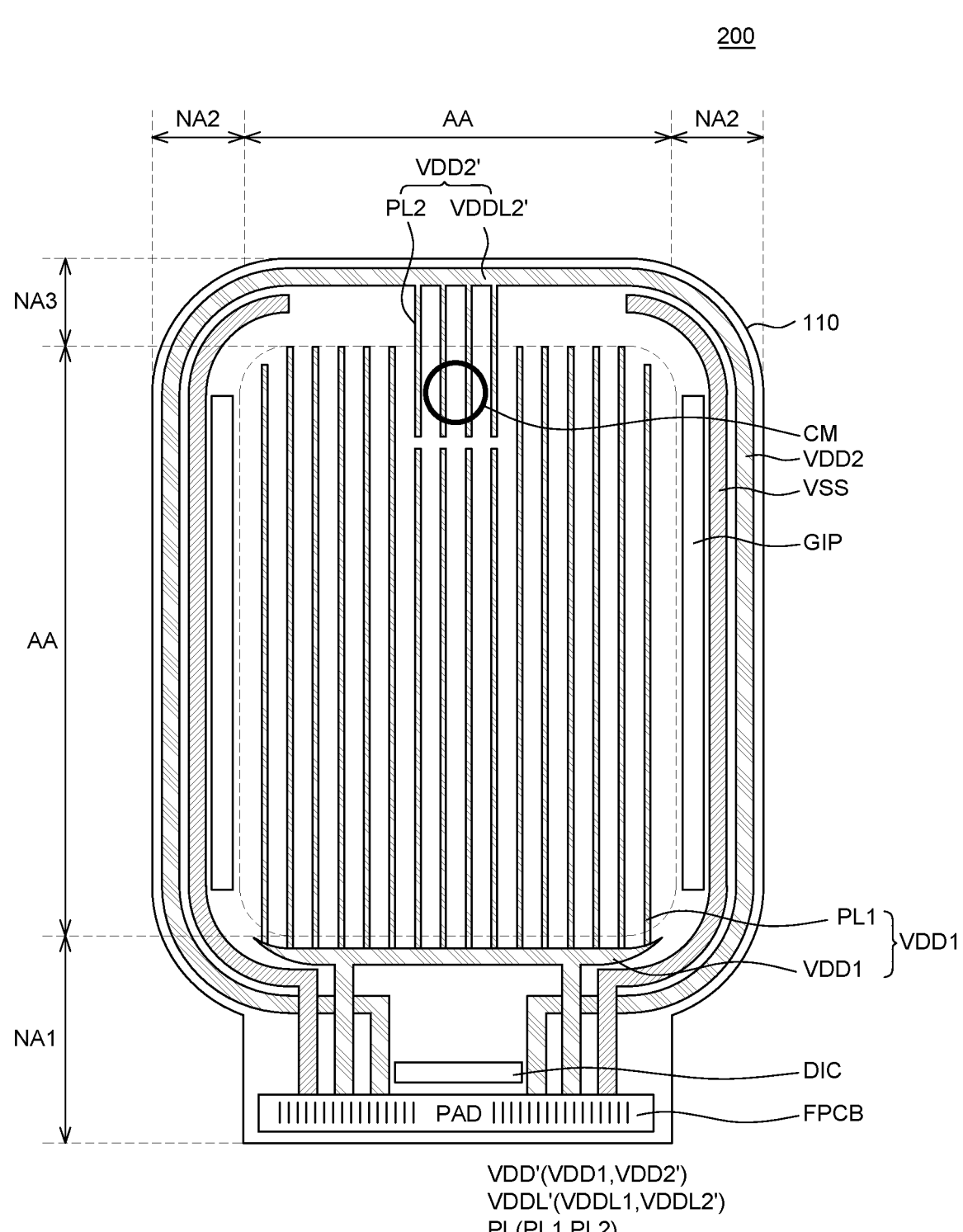
FIG. 7 is a schematic plan view of a display device according to another exemplary embodiment of the present disclosure.

FIG. 7 is a schematic plan view of a display device according to another exemplary embodiment of the present disclosure. Referring to FIG. 7, the difference of a display device 200 according to another exemplary embodiment of the present disclosure and the display device 100 of FIGS. 1 to 6 is the second high potential voltage line VDD2', but the other configuration is substantially the same so that a redundant description will be omitted.

The high potential voltage line VDD includes a first high potential voltage line VDD1 and a second high potential voltage line VDD2 which are electrically separated from each other. At this time, the first high potential voltage line VDD1 may be disposed in the first non-active area NA1 and the second high potential voltage line VDD2 may be disposed in the first to third non-active areas NA1, NA2, and NA3.

A second high potential voltage link line VDDL2 included in the second high potential voltage line VDD2 is disposed along the first to third non-active areas NA1, NA2, and NA3 adjacent to the active area AA of the substrate 110 with a constant line width. The second high potential voltage link line VDDL2 encloses a remaining portion excluding a part of the first non-active area NA1 adjacent to the active area AA of the substrate 110. One end of the second high potential voltage link line VDDL2 is disposed on one side of the first non-active area NA1 and the other end of the second high potential voltage link line VDDL2 is disposed on the other side of the first non-active area NA1. Specifically, referring to FIG. 7, a first end of the second high potential voltage line VDD2 is connected to one side of a flexible printed circuit board FPCB of the pad unit PAD and a second end of the second high potential voltage line VDD2 is connected to the other side of the flexible printed circuit board FPCB of the pad unit PAD. That is, the second high potential voltage line VDD2 may receive a second high potential voltage from a power management integrated circuit PMIC of the flexible printed circuit board FPCB. An area between one end and the other end of the second high potential voltage link line VDDL2 may be disposed so as to enclose the second non-active area NA2 and the third non-active area NA3. Accordingly, the second high potential voltage link line VDDL2 may have an inverted "U" shape in which one side corresponding to the first non-active area NA1 of the substrate 110 is open in the plan view.

Accordingly, the display device 200 according to another exemplary embodiment of the present disclosure may more efficiently control the second high potential voltage. The power management integrated circuit PMIC is applied with a system power voltage to generate and supply a high potential voltage and a low potential voltage for driving the display device 200. Referring to FIG. 7, not only the first high potential voltage line VDD1, but also the second high potential voltage line VDD2 may be disposed to be directly connected to the power management integrated circuit PMIC without passing through the data driving circuit DIC. Accordingly, without individually performing the optical compensation for the first high potential voltage in the power management integrated circuit PMIC and the optical compensation of the second high potential voltage in the data driving circuit DIC, the optical compensation for the first high potential voltage and the second high potential voltage is simultaneously performed in the power management integrated circuit PMIC. Accordingly, the high potential voltage may be more efficiently adjusted.

The exemplary embodiments of the present disclosure can also be described as follows:

According to an aspect of the present disclosure, there is provided a display device. The display device includes a substrate which includes an active area including a first active area and a second active area and a non-active area enclosing the active area. The display device further includes a first high potential voltage line which supplies a first high potential voltage to a plurality of first pixels of the first active area. The display device further includes a second high potential voltage line which supplies a second high potential voltage to a plurality of second pixels of the second active area. The first high potential voltage line and the second high potential voltage line are electrically isolated.

The display device may further include a camera which is disposed so as to correspond to the second active area.

A number of the plurality of first pixels per unit area may be larger than a number of the plurality of second pixels per unit area.

The first high potential voltage may be lower than the second high potential voltage.

In the same area, a maximum luminance of the first active area may be equal to a maximum luminance of the second active area.

The first active area may include a first area, M first pixels being provided in the first area, where M is an integer greater than 1, the second active area may include a second area, one second pixel being provided in the second area, and an area of the first area is same to an area of the second area.

Each of the M first pixels may have same maximum luminance, and the maximum luminance of each of the M first pixels is smaller than a maximum luminance of the one second pixel.

A sum of the maximum luminance of the M first pixels may be equal to a maximum luminance of the one second pixel.

The non-active area may include a first non-active area which extends from a lower side of the active area and includes a pad unit, a second non-active area extending from a left side and a right side of the active area, and a third non-active area extending from an upper side of the active area. A part of the first high potential voltage line may be disposed in the first non-active area. A part of the second high potential voltage line may be disposed to enclose the active area in the first non-active area, the second non-active area, and the third non-active area.

The first high potential voltage line may include a first high potential voltage link line disposed in the first non-active area and a first power line disposed in the first active area, and the second high potential voltage line may include a second high potential voltage link line disposed in the first non-active area, the second non-active area, and the third non-active area and a second power line disposed in the second active area.

The second active area may include: an area corresponding to a camera; and an auxiliary area disposed between the area corresponding to the camera and the second high potential voltage link line.

The first power line may include a first sub power line extending in a first direction and a second sub power line which extends in a second direction and is electrically connected to the first sub power line, and the second power line extends in the first direction.

The second power line may intersect the second sub power line between the area corresponding to the camera and the second high potential voltage link line.

The display device may further include a gate driving circuit and a low potential voltage line disposed between the second high potential voltage line and the active area in the second non-active area.

The second high potential voltage line may receive the second high potential voltage from a data driving circuit or a power management integrated circuit.

Both of the first high potential voltage line and the second high potential voltage line may be disposed to directly connect to a power management integrated circuit.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate including an active area and a non-active area that is at least partially around the active area, the active area including a first active area and a second active area partially surrounded by the first active area;

a thin film transistor disposed on the substrate in the active area and including an active layer, a gate electrode, a source electrode, and a drain electrode;

a first interlayer insulating layer disposed on the gate electrode;

a second interlayer insulating layer disposed on the first interlayer insulating layer, the source electrode and the drain electrode disposed on the second interlayer insulating layer;

a first planarization layer disposed on the source electrode, the drain electrode and the second interlayer insulating layer;

a second planarization layer disposed on the first planarization layer; and a conductive layer disposed on the first interlayer insulating layer in the active area, the conductive layer disposed between the first interlayer insulating layer and the second interlayer insulating layer;

a sensor in the second active area but not the first active area;

a first high potential voltage line that supplies a first high potential voltage to a plurality of first pixels in the first active area;

a first power line that is connected to the first high potential voltage line and includes a plurality of first sub power lines extending in a first direction in the first active area and a plurality of second sub power lines extending in a second direction that intersects the first direction in the first active area, the plurality of second sub power lines electrically connected to the plurality of first sub power lines;

a second high potential voltage line that supplies a second high potential voltage to a plurality of second pixels in the second active area;

a second power line that is connected to the second high potential voltage line and extends in the first direction such that the second power line overlaps the sensor in a plan view of the display device; and a low potential voltage line that supplies a voltage to at least one of cathode electrodes of light emitting elements included in the plurality of first pixels in the first active area or cathode electrodes of light emitting elements included in the plurality of second pixels in the second active area, the low potential voltage line disposed between the second high potential voltage line and the first active area in a plan view of the display device, wherein a portion of the second power line overlaps the sensor in the plan view without intersecting a power line that extends in the second direction, wherein the first high potential voltage line and the second high potential voltage line are electrically isolated from each other, wherein a side of the non-active area includes a first portion in which the second power line extends in the first direction and second and third portions on both sides of the first portion in a plan view of the display device, wherein the low potential voltage line is disposed between the second high potential voltage line and the first active area in at least a portion of each of the second and third portions, and is opened in the first portion to be non-overlapping the second power line and intersecting the first direction in which the second power line extends, wherein the second active area includes an area including the sensor and an auxiliary area between the area including the sensor and the second high potential voltage line, wherein a second sub power line from the plurality of second sub power lines that is adjacent to the second high potential voltage line continuously extends from a first portion of the first active area across the auxiliary area to a second portion of the first active area such that the second sub power line intersects the second power line in the auxiliary area, and remaining second sub power lines from the plurality of second sub power lines do not intersect the second power line.

2. The display device according to claim 1, wherein the sensor is a camera in the second active area.

3. The display device according to claim 1, wherein a number of first pixels per unit area from the plurality of first pixels is greater than a number of second pixels per unit area from the plurality of second pixels.

4. The display device according to claim 3, wherein the first high potential voltage supplied to the plurality of first pixels is less than the second high potential voltage supplied to the plurality of second pixels.

5. The display device according to claim 4, wherein a maximum luminance of the first pixels per unit area in the first active area is equal to a maximum luminance of the second pixels per unit area in the second active area.

6. The display device according to claim 1, wherein the first active area includes a first area comprising first pixels from the plurality of first pixels, and the second active area includes a second area comprising one second pixel from the plurality of second pixels, wherein an area of the first area is a same as an area of the second area.

7. The display device according to claim 6, wherein each of the first pixels in the first area has a same maximum luminance that is less than a maximum luminance of the one second pixel in the second area.

8. The display device according to claim 7, wherein a sum of the maximum luminance of the first pixels in the first area is equal to the maximum luminance of the one second pixel in the second area.

9. The display device according to claim 1, wherein the non-active area includes:

a first non-active area including a pad unit, the first non-active area extending from a first side of the active area that extends in a first direction;

a second non-active area extending from a third side and a fourth side of the active area, the third side and the fourth side extending in a second direction that intersects the first direction; and a third non-active area extending from a fifth side of the active area that extends in the first direction and is parallel to the first side of the active area, wherein a part of the first high potential voltage line is in the first non-active area, and a part of the second high potential voltage line encloses the active area in the first non-active area, the second non-active area, and the third non-active area.

10. The display device according to claim 9, wherein the first high potential voltage line includes a first high potential voltage link line in the first non-active area and the first power line in the first active area, and the second high potential voltage line includes the second power line in the second active area and a second high potential voltage link line in the first non-active area, the second non-active area, and the third non-active area.

11. The display device according to claim 9, further comprising:

a gate driving circuit between the second high potential voltage line and the active area in the second non-active area.

12. The display device according to claim 1, wherein the second high potential voltage line receives the second high potential voltage from a data driving circuit or a power management integrated circuit.

13. The display device according to claim 1, wherein both of the first high potential voltage line and the second high potential voltage line are directly connected to a power management integrated circuit.

14. A display device, comprising:

a substrate including an active area and a non-active area that is at least partially around the active area, the active area including a first active area and a second active area partially surrounded by the first active area;

a thin film transistor disposed on the substrate in the active area and including an active layer, a gate electrode, a source electrode, and a drain electrode;

a first interlayer insulating layer disposed on the gate electrode;

a second interlayer insulating layer disposed on the first interlayer insulating layer, the source electrode and the drain electrode disposed on the second interlayer insulating layer;

a first planarization layer disposed on the source electrode, the drain electrode and the second interlayer insulating layer;

a second planarization layer disposed on the first planarization layer; and a conductive layer disposed on the first interlayer insulating layer in the active area, the conductive layer disposed between the first interlayer insulating layer and the second interlayer insulating layer;

a sensor in the second active area but not the first active area;

a first high potential voltage line that supplies a first high potential voltage;

a first power line that is connected to the first high potential voltage line and includes a plurality of first sub power lines extending in a first direction in the first active area and a plurality of second sub power lines extending in a second direction that intersects the first direction in the first active area, the plurality of second sub power lines electrically connected to the plurality of first sub power lines;

a second high potential voltage line that supplies a second high potential voltage;

a second power line that is connected to the second high potential voltage line and extends in the first direction such that the second power line overlaps the sensor in a plan view of the display device;

a plurality of first pixels in the first active area, the plurality of first pixels supplied with the first high potential voltage;

a plurality of second pixels and a camera in the second active area, the plurality of second pixels supplied with the second high potential voltage that is different from the first high potential voltage; and a low potential voltage line that supplies a voltage to at least one of cathode electrodes of light emitting elements included in the plurality of first pixels in the first active area or cathode electrodes of light emitting elements included in the plurality of second pixels in the second active area, the low potential voltage line disposed between the second high potential voltage line and the first active area in a plan view of the display device, wherein a portion of the second power line overlaps the sensor in the plan view without intersecting a power line that extends in the second direction, wherein a side of the non-active area includes a first portion in which the second power line extends in the first direction and second and third portions on both sides of the first portion in a plan view of the display device, wherein the low potential voltage line is disposed between the second high potential voltage line and the first active area in at least a portion of each of the second and third portions, and is opened in the first portion to be non-overlapping the second power line and intersecting the first direction in which the second power line extends, wherein the second active area includes an area including the sensor and an auxiliary area between the area including the sensor and the second high potential voltage line, wherein a second sub power line from the plurality of second sub power lines that is adjacent to the second high potential voltage line continuously extends from a first portion of the first active area across the auxiliary area to a second portion of the first active area such that the second sub power line intersects the second power line in the auxiliary area, and remaining second sub power lines from the plurality of second sub power lines do not intersect the second power line.

15. The display device of claim 14, wherein the second high potential voltage is greater than the first high potential voltage.

16. The display device of claim 15, wherein the second high potential voltage line is electrically isolated from the first high potential voltage line.

17. The display device of claim 14, wherein a first portion in the first active area includes a first number of first pixels from the plurality of first pixels and a second portion in the second active area includes a second number of second pixels from the plurality of second pixels, the second number of second pixels less than the first number of first pixels, wherein an area of the first portion is a same as an area of the second portion.

18. The display device of claim 17, wherein a maximum luminance of the first portion substantially matches a maximum luminance of the second portion.

19. The display device of claim 18, wherein the second portion includes one second pixel having the maximum luminance of the second portion, and each of the first pixels in the first portion has a same maximum luminance that is less than the maximum luminance of the one second pixel and the maximum luminance of the first active area.

20. The display device of claim 19, wherein a sum of the maximum luminance of the first pixels is equal to the maximum luminance of the one second pixel.

21. A display device, comprising:

a substrate including an active area and a non-active area that is at least partially around the active area, the active area including a first active area and a second active area partially surrounded by the first active area;

a thin film transistor disposed on the substrate in the active area and including an active layer, a gate electrode, a source electrode, and a drain electrode;

a first interlayer insulating layer disposed on the gate electrode;

a second interlayer insulating layer disposed on the first interlayer insulating layer, the source electrode and the drain electrode disposed on the second interlayer insulating layer;

a first planarization layer disposed on the source electrode, the drain electrode and the second interlayer insulating layer;

a second planarization layer disposed on the first planarization layer; and a conductive layer disposed on the first interlayer insulating layer in the active area, the conductive layer disposed between the first interlayer insulating layer and the second interlayer insulating layer;

a camera in the second active area but not the first active area;

a first high potential voltage line that supplies a first high potential voltage;

a first power line that is connected to the first high potential voltage line and includes a plurality of first sub power lines extending in a first direction in the first active area and a plurality of second sub power lines extending in a second direction that intersects the first direction in the first active area, the plurality of second sub power lines electrically connected to the plurality of first sub power lines;

a second high potential voltage line that supplies a second high potential voltage;

a second power line that is connected to the second high potential voltage line and extends in the first direction such that the second power line overlaps the camera in a plan view of the display device and a portion of the second power line overlaps the camera in the plan view without intersecting a power line that extends in the second direction;

a plurality of first pixels in the first active area, the plurality of first pixels supplied with the first high potential voltage;

a plurality of second pixels in the second active area, the plurality of second pixels supplied with the second high potential voltage; and a low potential voltage line that supplies a voltage to at least one of cathode electrodes of light emitting elements included in the plurality of first pixels in the first active area or cathode electrodes of light emitting elements included in the plurality of second pixels in the second active area, the low potential voltage line disposed between the second high potential voltage line and the first active area in a plan view of the display device, wherein a first area in the first active area includes a first number of first pixels from the plurality of first pixels, and a second area in the second active area having a same area as the first area includes a second number of second pixels from the plurality of second pixels that is less than the first number of first pixels, but a maximum luminance of the second area is substantially the same as a maximum luminance of the first area, wherein a side of the non-active area includes a first portion in which the second power line extends in the first direction and second and third portions on both sides of the first portion in a plan view of the display device, wherein the low potential voltage line is disposed between the second high potential voltage line and the first active area in at least a portion of each of the second and third portions, and is opened in the first portion to be non-overlapping the second power line and intersecting the first direction in which the second power line extends, wherein the second active area includes an area including the camera and an auxiliary area between the area including the camera and the second high potential voltage line, wherein a second sub power line from the plurality of second sub power lines that is adjacent to the second high potential voltage line continuously extends from a first portion of the first active area across the auxiliary area to a second portion of the first active area such that the second sub power line intersects the second power line in the auxiliary area, and remaining second sub power lines from the plurality of second sub power lines do not intersect the second power line.

22. The display device of claim 21, wherein the second high potential voltage is greater than the first high potential voltage, wherein the first high potential voltage line and the second high potential voltage line are electrically isolated from each other.

* * * * *